United States Patent
Chou et al.

(10) Patent No.: US 10,924,125 B2
(45) Date of Patent: Feb. 16, 2021

(54) FREQUENCY DIVIDER CIRCUIT, METHOD AND COMPENSATION CIRCUIT FOR FREQUENCY DIVIDER CIRCUIT

(71) Applicant: TAIWAN SEMICONDUCTOR MANUFACTURING COMPANY LTD., Hsinchu (TW)

(72) Inventors: Mao-Hsuan Chou, Xinfeng Township (TW); Chih-Hsien Chang, New Taipei (TW); Ruey-Bin Sheen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/597,295

(22) Filed: Oct. 9, 2019

(65) Prior Publication Data

US 2020/0127671 A1   Apr. 23, 2020

Related U.S. Application Data

(60) Provisional application No. 62/749,461, filed on Oct. 23, 2018.

(51) Int. Cl.
*H03L 7/099*   (2006.01)

(52) U.S. Cl.
CPC ................. *H03L 7/0992* (2013.01)

(58) Field of Classification Search
CPC ................. H03L 7/0992; H03L 7/18
See application file for complete search history.

(56) References Cited

U.S. PATENT DOCUMENTS

| | | | | |
|---|---|---|---|---|
| 3,983,498 A * | 9/1976 | Malek | .......... | H03L 7/0992 327/156 |
| 4,631,496 A * | 12/1986 | Borras | .......... | H03C 3/0933 331/1 A |
| 6,137,332 A * | 10/2000 | Inoue | .......... | G06F 1/10 327/165 |
| 8,593,189 B1 * | 11/2013 | Yen | .......... | H03L 7/085 327/147 |
| 2006/0203954 A1 * | 9/2006 | Panpalia | .......... | H03K 23/68 377/47 |
| 2007/0245271 A1 * | 10/2007 | Feng | .......... | H03L 7/02 716/133 |
| 2010/0104313 A1 * | 4/2010 | Kosaka | .......... | G03G 15/1675 399/88 |
| 2018/0115410 A1 * | 4/2018 | Tajalli | .......... | H03L 7/0998 |

* cited by examiner

*Primary Examiner* — Kenneth T Lam
(74) *Attorney, Agent, or Firm* — Hauptman Ham, LLP

(57) ABSTRACT

A frequency divider circuit includes a counter configured to generate a counter signal responsive to a frequency of a clock signal and a frequency ratio, and a compensation circuit coupled to the counter, and configured to generate an output signal. The output signal has a frequency equal to the frequency of the clock signal divided by a frequency ratio, and a duty cycle greater than 1/r, where r is the frequency ratio.

20 Claims, 8 Drawing Sheets

FREQUENCY DIVIDER CIRCUIT, METHOD AND COMPENSATION CIRCUIT FOR FREQUENCY DIVIDER CIRCUIT

PRIORITY CLAIM

This application claims priority to U.S. Provisional Patent Application Ser. No. 62/749,461 filed Oct. 23, 2018, which is incorporated herein by reference in its entirety.

BACKGROUND

Phase locked loops (PLLs) are commonly used in microcontrollers, demodulators, oscillators, communication systems, or the like. A PLL produces an output signal having a phase that is correlated to the phase of a received input signal. A frequency divider is a circuit in a PLL that receives an input signal having a first frequency, and produces an output signal having a second frequency that is a divisible factor of the first frequency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
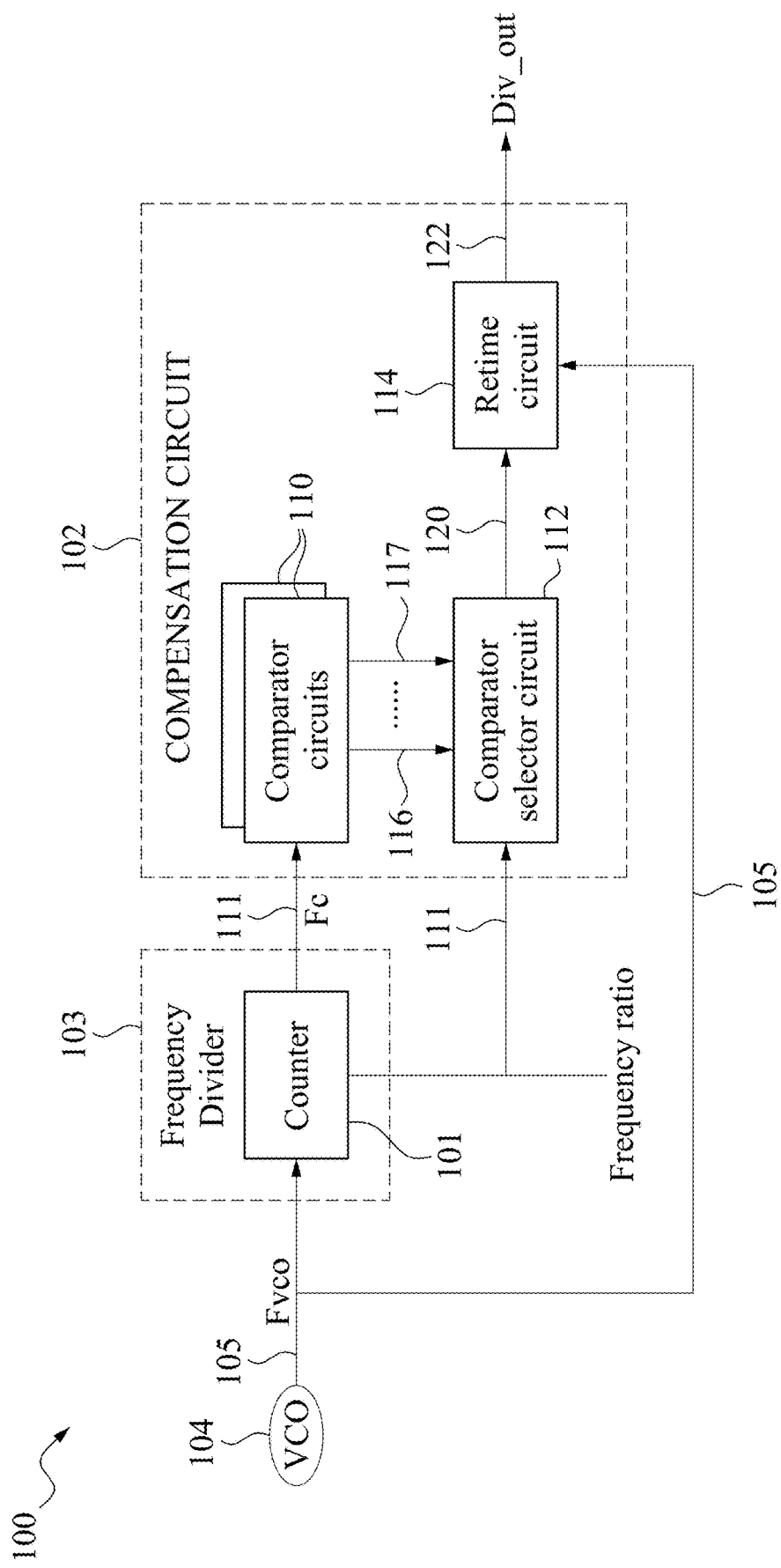
FIG. 1 is a schematic block diagram of a frequency divider circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

One or more embodiments describe an approach to improving a duty cycle of the output signal of a frequency divider circuit. Duty cycle is a ratio between the time period during which a signal is active during one cycle of the signal and the total period of one cycle of the signal. In some circuit configurations, a signal is active when the signal is in a logic "high" state. In other circuit configurations, a signal is active when the signal is in a logic "low" state. At a high frequency ratio by which a frequency divider circuit divides the frequency of an input signal to obtain a lower frequency for the output signal, there is a concern that the duty cycle of the output signal becomes too small, with further undesirable consequences on circuit performance. To address such concern, in some embodiments, a compensation circuit is coupled to a counter in a frequency divider circuit, and is configured to generate an output signal having a frequency equal to the frequency of an input signal divided by a frequency ratio. The output signal also has a duty cycle compensated for by the compensation circuit to be within a specified range, e.g., greater than 1 divided by the frequency ratio. With the improved duty cycle, circuit performance is also improved. In at least one embodiment, the compensation circuit is implemented by a few simple logic gates, without a significant increase in power consumption or chip area.

FIG. 1 is a schematic block diagram of a frequency divider circuit 100, in accordance with some embodiments. The frequency divider circuit 100 includes a counter 101 and a compensation circuit 102 coupled to the counter 101.

In at least one embodiment, the counter 101 is an internal counter of a preexisting frequency divider 103 which uses a counter signal of the counter 101 to generate a frequency-divided signal in accordance with a frequency ratio. In at least one embodiment, the counter 101 is a standalone counter. The counter 101 is coupled to a voltage controlled oscillator (VCO) 104 to receive a signal 105 from the VCO 104. The signal 105 generated by the VCO 104 operates as a clock signal having a frequency $F_{VCO}$ for the frequency divider circuit 100. Other sources for generating the clock signal 105 are within the scopes of various embodiments. In the example configuration in FIG. 1, a frequency ratio is a variable integer value input into the counter 101, via a signal 118, from other circuitry. In at least one embodiment, the frequency ratio is embedded or stored in the counter 101. The counter 101 includes a circuit, for example, one or more flip-flops, configured to count-down a counter value from the frequency ratio. In some embodiments described herein, counting down from the frequency ratio means counting from a value equal to the frequency ratio minus one, down to zero. For example, counting down from the frequency ratio of 10 means, in some embodiments, counting from 9 down to zero. In a count-down configuration, the counter 101 decrements the counter value by one responsive to each full cycle of the clock signal 105. Other configurations of the counter 101, e.g., count-up configurations, are within the scopes of various embodiments. The counter value is output from the counter 101 in a counter signal 111 (also indicated as Fc in FIG. 1). The counter signal 111 is responsive to the frequency $F_{VCO}$ of the clock signal 105.

The compensation circuit 102 is coupled to the counter 101, receives the signal 118 indicating the frequency ratio, and is configured to generate an output signal Div_out having a frequency equal to the frequency $F_{VCO}$ of the clock signal 105 divided by the frequency ratio, and a duty cycle within a specified range, e.g., greater than 1 divided by the frequency ratio. In the example configuration in FIG. 1, the compensation circuit 102 comprises a plurality of comparator circuits commonly referred to as 110, a comparator selector circuit 112, and a retime circuit 114. In at least one embodiment, the retime circuit 114 is omitted.

The comparator circuits 110 are coupled to the output of the counter 101 to receive the counter signal 111. The comparator circuits 110 receive the counter signal 111 indicative of the counter value of the counter 101. The comparator circuits 110 have different thresholds. Each of the comparator circuits 110 is configured to compare the counter value in the counter signal 111 with the corresponding thresholds, and output a corresponding comparator output signal responsive to the comparison. For example, a logic level of the comparator output signal of each comparator circuit 110 is switched, e.g., from logic "high" to logic "low," responsive to the counter value of the counter signal 111 reaching the corresponding threshold. Because the comparator circuits 110 have different thresholds, the comparator output signals (schematically indicated as 116, 117 in FIG. 1) will switch their logic levels at different timings as the counter value is counted by the counter 101. The comparator output signals 116, 117 with logic levels switched at different timings are selectively used to automatically adjust or compensate for the duty cycle of an output signal from the frequency divider circuit 100 as described herein.

The comparator selector circuit 112 is coupled to outputs of the comparator circuits 110 to receive the comparator output signals 116, 117, and is configured to select from the comparator output signals 116, 117 a comparator output signal corresponding to the frequency ratio. In the example configuration in FIG. 1, the frequency ratio is a variable integer value input into the comparator selector circuit 112, via the signal 118, from other circuitry. In at least one embodiment, the frequency ratio is embedded or stored in the comparator selector circuit 112. The comparator selector circuit 112 has a plurality of different numeric ranges corresponding to the comparator output signals 116, 117 received from the comparator circuits 110. Responsive to the frequency ratio falling in a numeric range among the plurality of different numeric ranges, the comparator selector circuit 112 selects the comparator output signal corresponding to the numeric range containing the frequency ratio. The selected comparator output signal is output by the comparator selector circuit 112 as a signal 120. A frequency of the signal 120 is equal to $F_{VCO}$ divided by the frequency ratio. A duty cycle of the signal 120 is obtained by dividing the threshold of the comparator circuits 110 corresponding to the selected comparator output signal by the frequency ratio.

Specifically, when the frequency ratio input via the signal 118 has a first, lower value r1 that falls in a first, lower numeric range of the comparator selector circuit 112, the comparator selector circuit 112 selects the comparator output signal 116 corresponding to a first, lower threshold Th1 among the different thresholds of the comparator circuits 110, and outputs the comparator output signal 116 as the signal 120. In this situation, the duty cycle of the signal 120 is Th1/r1. In contrast, at the same value r1 of the frequency ratio, the duty cycle of an output signal from a frequency divider in accordance with other approaches is 1/r1, i.e., lower than Th1/r1, because Th1 is higher than 1.

Similarly, when the frequency ratio input via the signal 118 has a second, higher value r2 that falls in a second, higher numeric range of the comparator selector circuit 112, the comparator selector circuit 112 selects the comparator output signal 117 corresponding to a second, higher threshold Th2 among the different thresholds of the comparator circuits 110, and outputs the comparator output signal 117 as the signal 120. In this situation, the duty cycle of the signal 120 is Th2/r2, where Th2>Th1 and r2>r1. In contrast, at the same value r2 of the frequency ratio, the duty cycle of an output signal from a frequency divider in accordance with other approaches is 1/r2, i.e., lower than Th2/r2, because Th2 is higher than 1.

Accordingly, at the same frequency ratio, the duty cycle of the signal 120 in accordance with some embodiments is compensated for, i.e., increased, compared to duty cycles of output signals from frequency dividers in accordance with other approaches.

Further, responsive to a value of the frequency ratio, e.g., r1 or r2, it is possible in some embodiments to automatically adjust the corresponding duty cycle of the signal 120, e.g., Th1/r1 or Th2/r2, to be within a specific range suitable for circuit performance of the frequency divider circuit 100 and/or other circuitry receiving the signal 120. In at least one embodiment, the specific range of the duty cycle of the signal 120 is achievable at various values of the frequency ratio by selecting, e.g., when designing the frequency divider circuit 100, appropriate thresholds Th1, Th2, etc. of the comparator circuits 110 and/or appropriate numeric ranges at which the comparator selector circuit 112 selects a comparator output signal corresponding to the frequency ratio, as described herein. In at least one embodiment, the specific range of the duty cycle of the signal 120 is between 25-50%.

In at least one embodiment, the retime circuit 114 is omitted and the signal 120 is output as the output signal of the frequency divider circuit 100. However, in some situations, one or more of the counter 101, comparator circuits 110 and comparator selector circuit 112 cause a undesirable delay or phase-shift between the clock signal 105 and the signal 120. Specifically, there is a concern that a rising edge of the clock signal 105 is shifted in phase from a rising edge of the signal 120. Such a concern is addressed by including the retime circuit 114 in the frequency divider circuit 100 in accordance with some embodiments. The retime circuit 114 is coupled to the output of the comparator selector circuit 112, and is configured to receive the clock signal 105. The retime circuit 114 is configured to generate an output signal 122 responsive to the frequency of the clock signal 105 and the selected comparator output signal output by the comparator selector circuit 112 as the signal 120. For example, the retime circuit 114 is configured to synchronize the signal 120 with the clock signal 105 to generate the output signal 122 (also indicated as Div_out in FIG. 1). The output signal 122 is essentially the signal 120 shifted in time (or phase) to have a rising edge coinciding with a rising edge of the clock signal 105. In some embodiments, the delay or phase-shift between the clock signal 105 and the signal 120 is less than one clock cycle of the clock signal 105. Therefore, when the signal 120 is synchronized with the clock signal 105 and output by the retime circuit 114 as the output signal 122, the output signal 122 is delayed by only one clock cycle from the input clock signal 105. As a result, the processing speed of the frequency divider circuit 100 and/or other circuitry receiving the signal 122 is not significantly affected.

Figure 2:
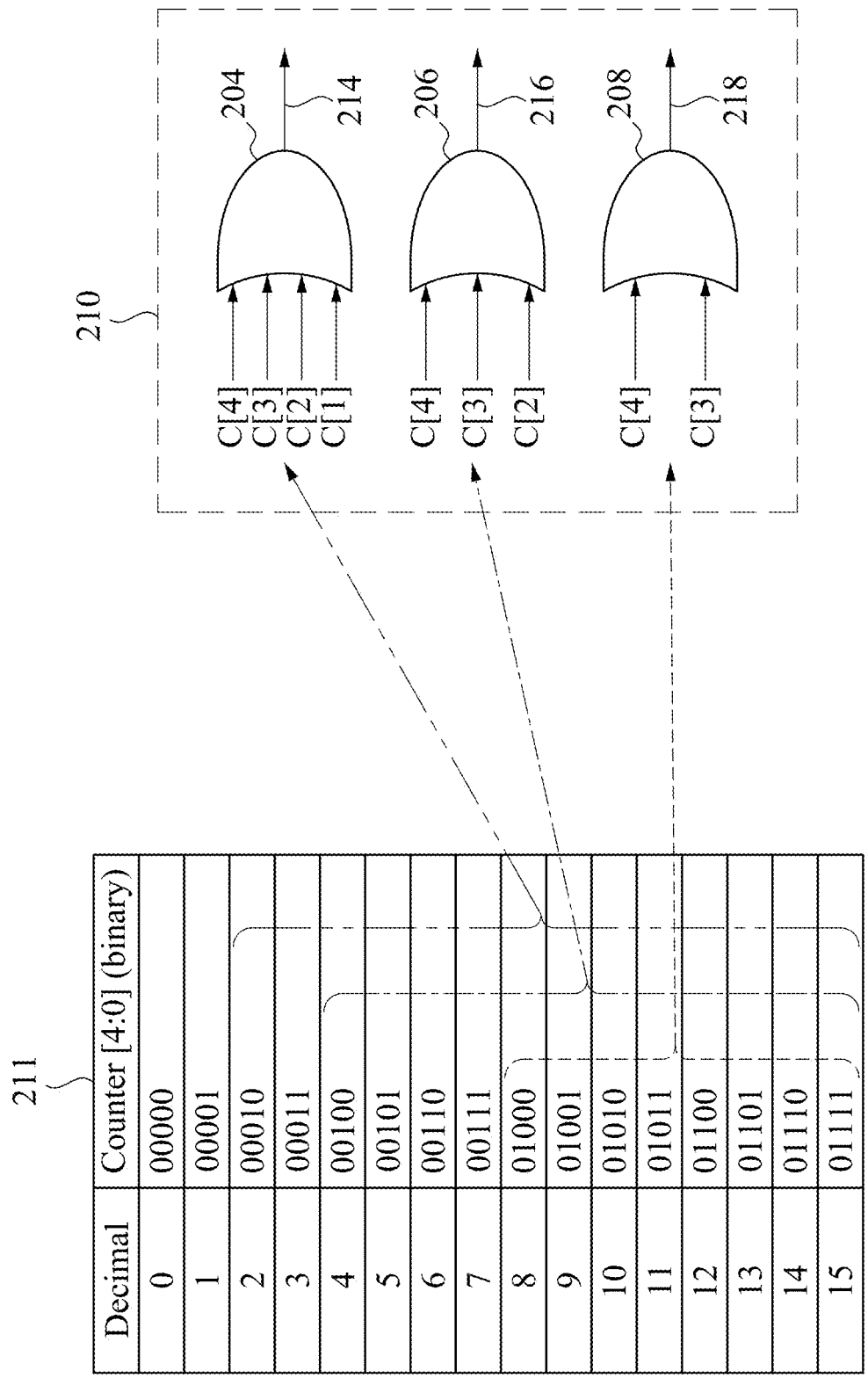
FIG. 2 is a diagram showing an example configuration of comparator circuits of a frequency divider circuit, in accordance with some embodiments.

FIG. 2 is a diagram showing an example configuration of comparator circuits 210 of a frequency divider circuit, in accordance with some embodiments. In at least one embodiment, the comparator circuits 210 correspond to the comparator circuits 110 in frequency divider circuit 100. The comparator circuits 210 are coupled to receive a counter signal 211. In at least one embodiment, the counter signal 211 corresponds to the counter signal 111 described with respect to FIG. 1. Decimal and binary representations of counter values in the counter signal 211 are presented in the table form in FIG. 2. In the example configuration in FIG. 2, the counter signal 211 has five bits C[0]-C[4] that represent counter values between 0 and 15 in binary form.

The comparator circuits 210 include a number of comparators 204, 206, 208, for example, three comparators in the example configuration in FIG. 2. Each of the comparators 204, 206, 208 is an OR gate coupled to receive a different set of bits of the counter signal 211. The different sets of bits input to the comparators 204, 206, 208 represent different thresholds of the comparators 204, 206, 208, and correspond to the different thresholds of the comparator circuits 110 described with respect to FIG. 1.

For example, the comparator 204 is an OR gate that receives as input the bits C[1]-C[4] of the counter signal 211. A comparator output signal 214 at the output of the comparator 204 is at logic "high" (i.e., "1") when any of the bits C[1]-C[4] is at logic "high," i.e., when the counter value in the counter signal 211 is greater than or equal to 2. In other words, the comparator 204 has a threshold of 2, and is also referred to herein as ">2 comparator."

The comparator 206 is an OR gate that receives as input the bits C[2]-C[4] of the counter signal 211. A comparator output signal 216 at the output of the comparator 206 is at logic "high" (i.e., "1") when any of the bits C[2]-C[4] is at logic "high," i.e., when the counter value in the counter signal 211 is greater than or equal to 4. In other words, the comparator 206 has a threshold of 4, and is also referred to herein as ">4 comparator."

The comparator 208 is an OR gate that receives as input the bits C[3]-C[4] of the counter signal 211. A comparator output signal 218 at the output of the comparator 208 is at logic "high" (i.e., "1") when any of the bits C[3]-C[4] is at logic "high," i.e., when the counter value in the counter signal 211 is greater than or equal to 8. In other words, the comparator 208 has a threshold of 8, and is also referred to herein as ">8 comparator."

The comparators 204, 206, 208 are also referred to as power-of-two comparators, because their thresholds are presentable in the form of Z, where j is an integer. To accommodate higher frequency ratios and associated higher counter values, in some embodiments, the counter signal 211 has more than 5 bits and/or more power-of-two comparators, such as ">16 comparator," ">32 comparator," etc., are included in the comparator circuits 210.

In the example configuration in FIG. 2, as the counter value in the counter signal 211 is counted down, or decremented, from the frequency ratio, the comparator output signals 214, 216, 218 will switch their logic levels at different timings, i.e., the comparator output signal 218 will switch from logic "high" to logic "low" first when the counter value is decremented to 7, then the comparator output signal 216 will switch from logic "high" to logic "low" when the counter value is decremented to 3, and next the comparator output signal 214 will switch from logic "high" to logic "low" when the counter value is decremented to 1. In at least one embodiment, the comparator output signals 214, 216, 218 correspond to the comparator output signals 116, 117, and are output to a comparator selector circuit as described with respect to FIG. 1. The described configuration using OR gates configured as power-of-two comparators is an example. Other comparator configurations are within the scopes of various embodiments. For example, comparators other than OR gates are implemented in some embodiments, and/or thresholds other than $2^j$ are implemented in at least one embodiment.

Figure 3:
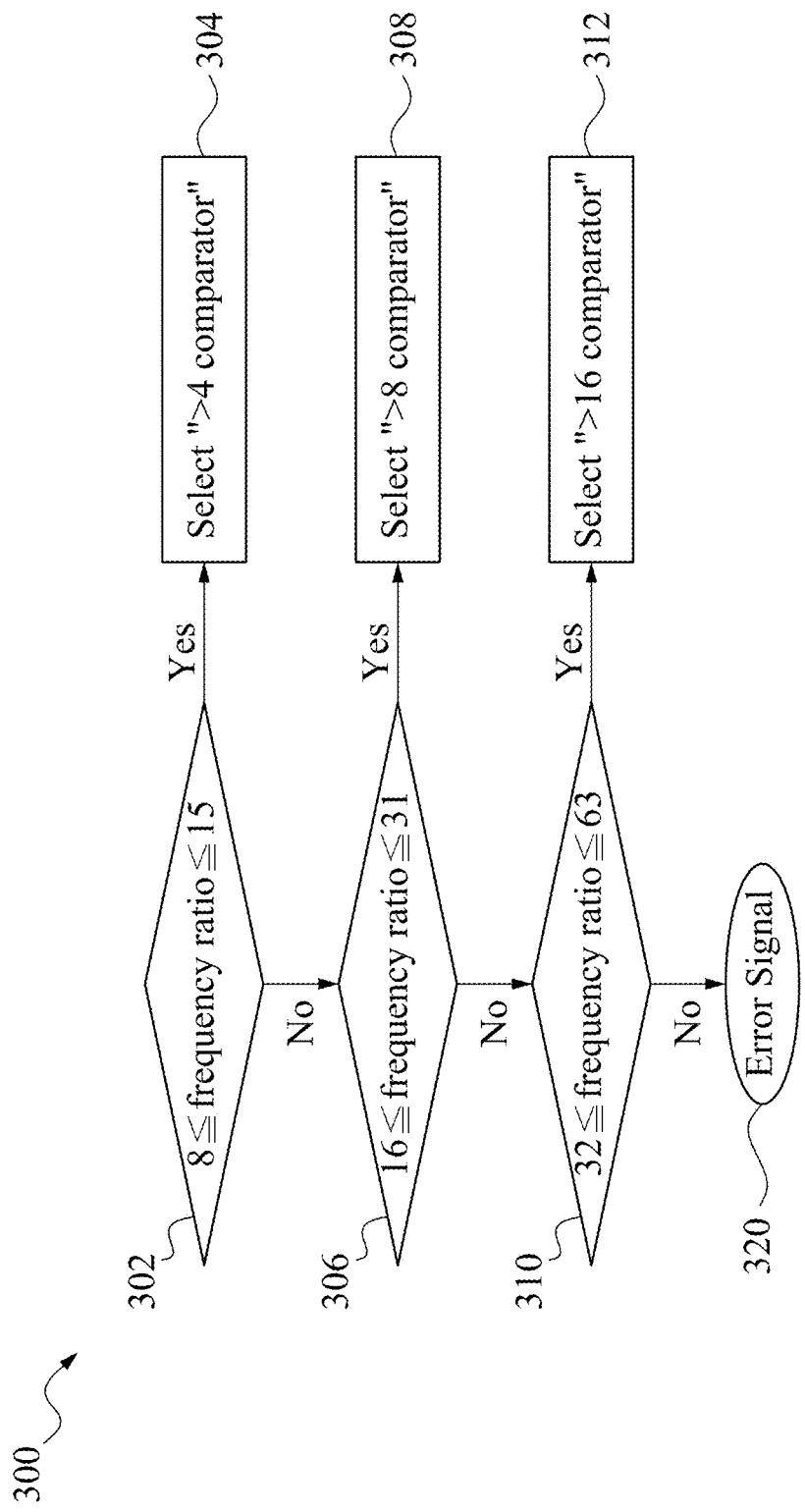
FIG. 3 is a flowchart of an example algorithm performed by a comparator selector circuit of a frequency divider circuit, in accordance with some embodiments.

FIG. 3 is a flowchart of an example algorithm performed by a comparator selector circuit 300 of a frequency divider circuit, in accordance with some embodiments. In at least one embodiment, the comparator selector circuit 300 corresponds to the comparator selector circuit 112 described with respect to FIG. 1, and is configured to receive a signal representing the frequency ratio. In the example configuration in FIG. 3, the comparator selector circuit 300 is configured to receive comparator output signals from a plurality of power-of-two comparators, such as ">4 comparator," ">8 comparator," and ">16 comparator," similar to the comparators 204, 206, 208 described with respect to FIG. 2. The comparator selector circuit 300 has a plurality of different numeric ranges corresponding to the comparator output signals input into the comparator selector circuit 300, and is configured to select and output the comparator output signal corresponding to a numeric range containing the frequency ratio. The selected comparator output signal is output by the comparator selector circuit 300 and, in some embodiments, corresponds to the signal 120 described with respect to FIG. 1.

For example, at operation 302, the comparator selector circuit 300 determines if the frequency ratio is a value greater than or equal to 8 and less than or equal to 15. If the frequency ratio is greater than or equal to 8 and less than or equal to 15 (Yes from operation 302), the comparator selector circuit 300 selects, at operation 304, the corresponding comparator output signal from the ">4 comparator" to be output. In other word, the comparator selector circuit 300 has a first numeric range from 8 to 15 that corresponds to a first comparator output signal from the ">4 comparator."

At operation 306 (No from operation 302), the comparator selector circuit 300 determines if the frequency ratio is a value greater than or equal to 16 and less than or equal to 31. If the frequency ratio is greater than or equal to 16 and less than or equal to 31 (Yes from operation 306), the comparator selector circuit 300 selects, at operation 308, the corresponding comparator output signal from the ">8 comparator" to be output. In other word, the comparator selector circuit 300 has a second numeric range from 16 to 31 that corresponds to a second comparator output signal from the ">8 comparator."

At operation 310 (No from operation 306), the comparator selector circuit 300 determines if the frequency ratio is a value greater than or equal to 32 and less than or equal to 63. If the frequency ratio is greater than or equal to 32 and less than or equal to 63 (Yes from operation 310), the comparator selector circuit 300 selects, at operation 312, the corresponding comparator output signal from the ">16 comparator" to be output. In other word, the comparator selector circuit 300 has a third numeric range from 32 to 63 that corresponds to a third comparator output signal from the ">16 comparator." The described numeric ranges of the comparator selector circuit 300 are non-overlapping and are presentable as from $2^k$ to $(2^{k+1}-1)$, where k is an integer. The described format and/or specific numbers of the numeric ranges are examples. Other configurations are within the scopes of various embodiments.

At operation 312 (No from operation 310), the comparator selector circuit 300 determines that the frequency ratio is a value greater than 63, i.e., beyond an operational frequency ratio range of the comparator selector circuit 300 and/or the frequency divider circuit in which the comparator selector circuit 300 is included, and the comparator selector circuit 300 outputs an error signal at operation 320. In some embodiments, when the frequency ratio is controlled by the counter or external circuitry to be within the operational frequency ratio range, operation 312 is omitted. In the example configuration in FIG. 3, the comparator selector circuit 300 and/or the frequency divider circuit in which the comparator selector circuit 300 is included is/are not configured to operate at the frequency ratio between 1-7, therefore, a numeric range between 1 and 7 is omitted in the comparator selector circuit 300. To accommodate higher or lower frequency ratios than described in the example configuration of FIG. 2, the comparator selector circuit 300 is configured to receive more or less comparator output signals and/or to include more or less numeric ranges. Any logic circuitry configured to perform the algorithm described with respect to FIG. 3 is usable as the comparator selector circuit 300 in some embodiments. In at least one embodiment, the comparator selector circuit 300 comprises a multiplexer.

Figure 4:
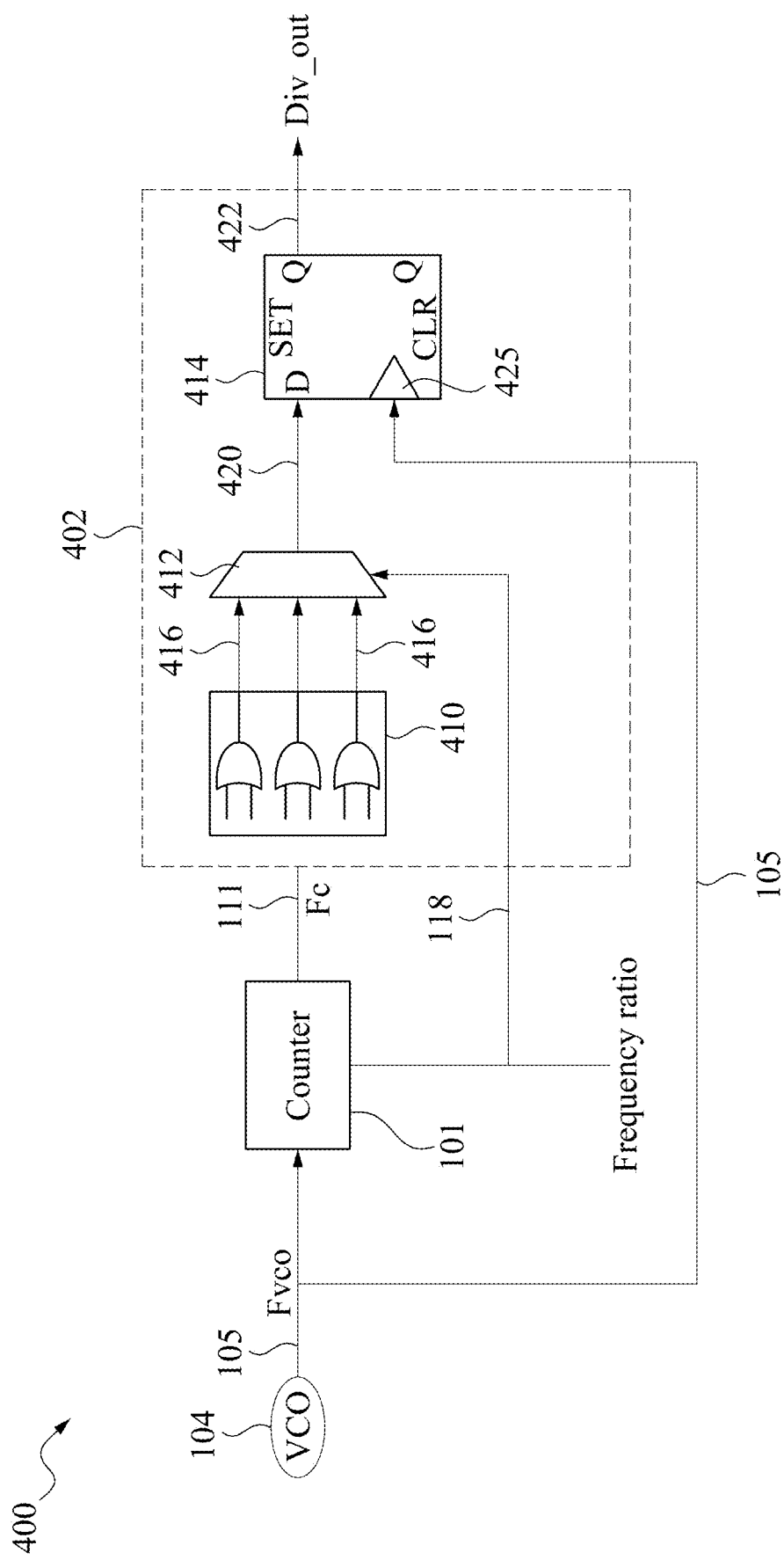
FIG. 4 is a schematic circuit diagram of an example circuit implementation of a frequency divider circuit, in accordance with some embodiments.

FIG. 4 is a schematic circuit diagram of an example circuit implementation of a frequency divider circuit 400, in accordance with some embodiments. The frequency divider circuit 400 includes a counter 101 and a compensation circuit 402 coupled to the counter 101. In at least one embodiment, the compensation compensation circuit 102 described with respect to FIG. 1. The compensation circuit 402 includes a plurality of comparators commonly referred to as 410, a multiplexer 412, and a flip-flop 414. In at least one embodiment, the comparators 410 correspond to the comparator circuits 110, the multiplexer 412 corresponds to the comparator selector circuit 112, and the flip-flop 414 corresponds to the retime circuit 114 described with respect to FIG. 1.

In an example implementation described herein, the comparators 410 include power-of-two comparators corresponding to those described with respect to FIG. 2, and the multiplexer 412 is configured to perform an algorithm corresponding to that described with respect to FIG. 3. More specifically, different sets of bits of the counter signal 111 are input into the comparators 410, and comparator output signals 416 of the comparators 410 are input into the multiplexer 412. The multiplexer 412 receives the frequency ratio via the signal 118 and selects one of the comparator output signals 416 corresponding to the frequency ratio to be output as signal 420 which, in some embodiments, corresponds to the signal 120 described with respect to FIG. 1.

The flip-flop 414, for example, an edge triggered flip-flop, has a first input terminal 425 configured to receive the clock signal 105, a second input terminal, i.e., D input terminal, configured to receive the signal 420 output by the multiplexer 412, and an output terminal, i.e., Q output terminal, configured to output an output signal 422. The flip-flop 414 is configured to synchronize the signal 420 output from the multiplexer 412 with the clock signal 105, and the output signal 422 output by the flip-flop 414 corresponds to the output signal 122 described with respect to FIG. 1, in at least one embodiment. Example operations of the frequency divider circuit 400 at various frequency ratio values are described with respect to FIGS. 5 and 6.

Figure 5:
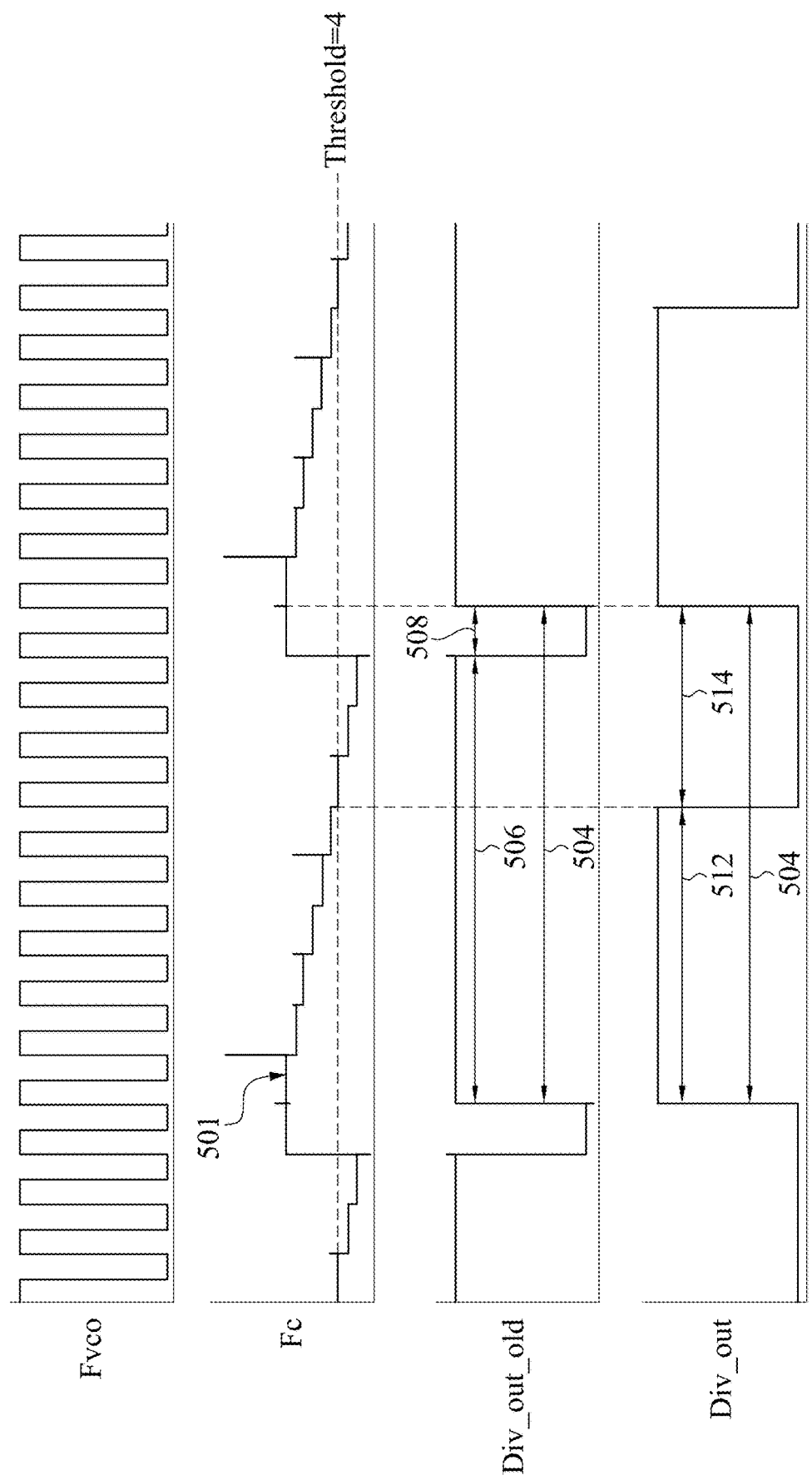
FIG. 5 includes time graphs of various signals in a frequency divider circuit in accordance with some embodiments, at a first frequency ratio.

FIG. 5 includes time graphs of various signals in the frequency divider circuit 400 in accordance with some embodiments, at a first frequency ratio. For example, the first frequency ratio is 10. The signal 105 (indicated as $F_{VCO}$ in FIG. 5) is input into the counter 101 which also receives the signal 118 (not shown in FIG. 5) indicating the frequency ratio of 10. The counter 101 starts to count down from the frequency ratio. As described herein, counting down from the frequency ratio of 10 means counting down from 9 to zero, and the counter 101 starts to count from 9 at 501. The counter signal 111 of the counter 101, with the counter value being counted down from 9, at 501, is indicated as Fc in FIG. 5. The frequency ratio of 20 is also input to the multiplexer 412 which determines that the frequency ratio of 10 falls in a numeric range from 8 to 15 and selects, among the comparator output signals of the comparators 410, the comparator output signal of a ">4 comparator" in accordance with the algorithm described with respect to FIG. 3. The "threshold=4" of the selected ">4 comparator" is indicated in FIG. 5. The selected comparator output signal of the selected ">4 comparator" switches from logic "high," which corresponds to an inactive state, to logic "low," which corresponds to an active state, when the counter value is decremented below the threshold of 4 as described with respect to FIG. 2. In other words, the selected comparator output signal of the selected ">4 comparator" is active at logic "low" when the counter value is 3, 2, 1 and zero. This selected comparator output signal is output from the multiplexer 412, synchronized with the clock signal 105 by the flip-flop 414, and output from the flip-flop 414 as the output signal 422 which is indicated as Div_out in FIG. 5. A comparative output signal Div_out_old of a frequency divider circuit in other approaches, which do not include a compensation circuit, is also indicated in FIG. 5.

For the comparative output signal Div_out_old, lines 504 indicate the total period of one cycle of both Div_out and Div_out_old. Line 506 indicates the total "off" time in one cycle when Div_out_old is inactive, and line 508 indicates the total "on" time in one cycle when Div_out_old is active. The duty cycle of Div_out_old is defined as the total "on" time 508 divided by the total period 504, or as (1/frequency ratio)×100%, or 10% for the frequency ratio of 10. The limited duty cycle of Div_out_old is caused by Div_out_old being active at logic "low" only in one cycle of $F_{VCO}$ when the counter value reaches zero.

For the output signal Div_out in the example configuration in accordance with some embodiments, line 512 indicates the total "off" time in one cycle when Div_out is inactive, and line 514 indicates the total "on" time in one cycle when Div_out is active. The duty cycle of Div_out is defined as the total "on" time 514 divided by the total period 504, or as (threshold/frequency ratio)×100%. At the threshold of 4 (corresponding to the selected ">4 comparator") and the frequency ratio of 10, the duty cycle of Div_out is 40%, i.e., higher than the duty cycle of 10% of the comparative output signal. The increase of the duty cycle of Div_out is caused by Div_out being active at logic "low" while the counter value is at 3, 2, 1 and zero below the threshold value of 4, i.e., during four cycles of $F_{VCO}$.

As can be seen from FIG. 5, both output signal Div_out and comparative output signal Div_out_old have the same total period 504 of one cycle, and therefore, have the same frequency which is obtained by dividing the frequency of the clock signal 105 (or $F_{VCO}$) by the frequency ratio. For example, at $F_{VCO}$ of 200 MHz and the frequency ratio of 10, both Div_out and Div_out_old have the frequency of 20 Mhz. However, due to the limited duty cycle of 10%, the pulse width (i.e., 508) of Div_out_old is only 5 ns. In contrast, with the higher duty cycle of 40%, the pulse width (i.e., 514) of Div_out is four times wider, at 20 ns.

The higher duty cycle and the associated wider pulse width of Div_out in accordance with some embodiments ensures circuit performance of the frequency divider circuit 100/400 and/or other circuitry receiving the output signal from the frequency divider circuit 100/400. For example, when the output signal from a frequency divider circuit is supplied to a level shifter, the pulse width of the output signal from the frequency divider circuit is the time period for the level shifter to switch its output between two voltage levels. When a voltage difference between the two voltage levels of the level shifter is relatively high (e.g., 1.8V, compared to 0.75 V at the output of the frequency divider circuit), a narrow pulse width of the output signal from a frequency divider circuit in other approaches, such as the comparative Div_out_old, may not be sufficient for the level shifter to completely or successfully switch from one voltage level to another. As a result, the operation of the level shifter becomes inaccurate or even fails. In contrast, the pulse width of the output signal from a frequency divider circuit in accordance with some embodiments, such as Div_out, is several times wider than Div_out_old, and therefore provides sufficient time for the level shifter to completely or successfully switch from one voltage level to another. This advantage of the frequency divider circuit in accordance with some embodiments becomes even more apparent at a higher frequency ratio, as described with respect to FIG. 6.

Figure 6:
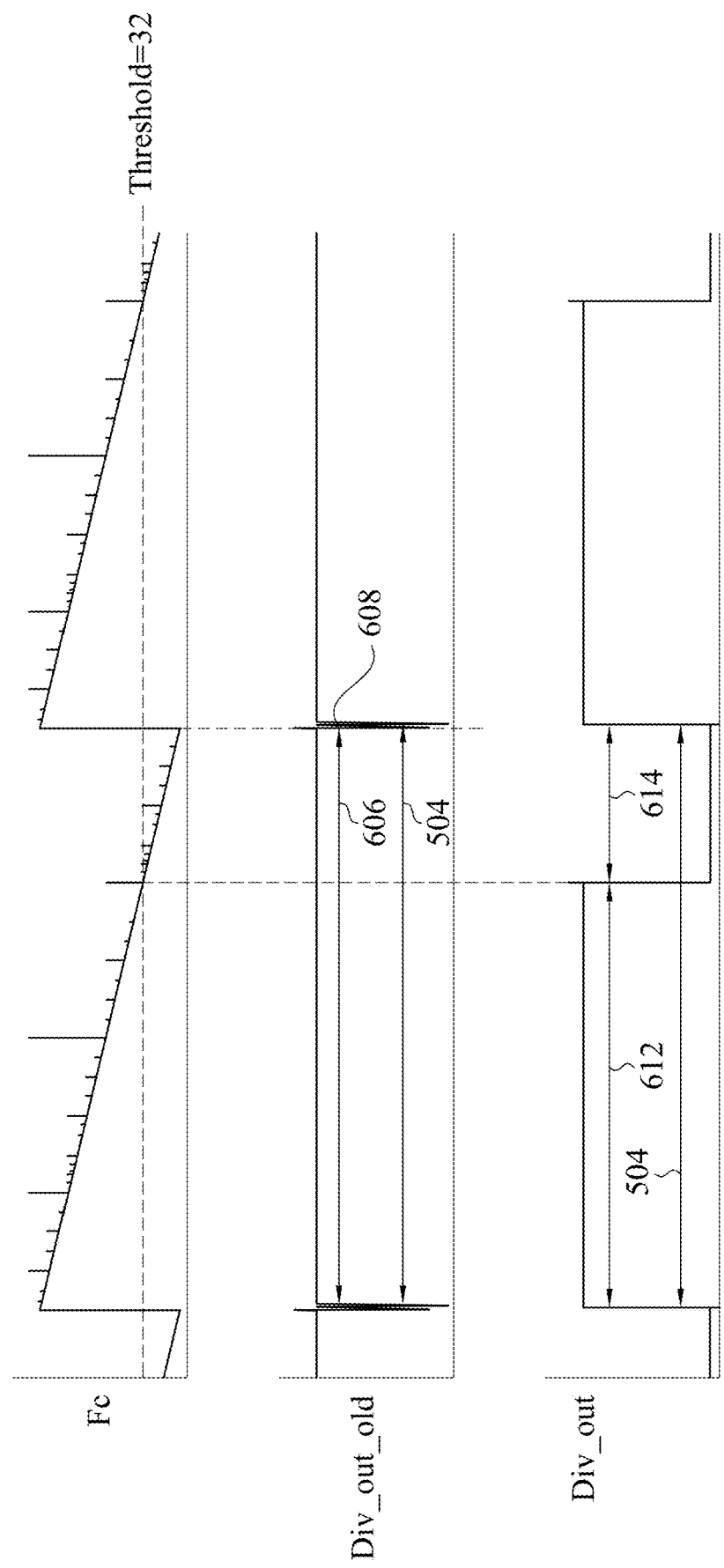
FIG. 6 includes time graphs of various signals in a frequency divider circuit in accordance with some embodiments, at a second frequency ratio.

FIG. 6 includes time graphs of various signals in the frequency divider circuit 400 in accordance with some embodiments, at a second frequency ratio. For example, the second frequency ratio is 120. At the same frequency of 20 MHz at the output of the frequency divider circuit, but with a higher frequency ratio of 120, the frequency of the clock signal 105 is 2400 MHz, compared to 200 MHz in FIG. 5. For simplicity, the clock signal 105 (or $F_{VCO}$) is omitted in FIG. 6. The counter 101 counts down from the frequency ratio of 120. As described herein, counting down from the frequency ratio of 120 means counting down from 119 to zero. The counter signal 111 of the counter 101, with the counter value being counted down from 119, is indicated as Fc in FIG. 6. The frequency ratio of 120 is also input to the multiplexer 412 which determines that the frequency ratio of 120 falls in a numeric range from 64 to 127 and selects, among the comparator output signals of the comparators 410, the comparator output signal of a ">32 comparator" in accordance with an algorithm similar to that described with respect to FIG. 3. The "threshold=32" of the selected ">32 comparator" is indicated in FIG. 6. The selected comparator output signal of the selected ">32 comparator" switches from logic "high," which corresponds to an inactive state, to logic "low," which corresponds to an active state, when the counter value is decremented below the threshold of 32, in a manner similar to FIG. 2. In other words, the selected comparator output signal of the selected ">32 comparator" is active at logic "low" when the counter value is 31, 30, . . . and zero. This selected comparator output signal is output from the multiplexer 412, synchronized with the clock signal 105 by the flip-flop 414, and output from the flip-flop 414 as the output signal 422 which is indicated as Div_out in FIG. 6. A comparative output signal Div_out_old of a frequency divider circuit in other approaches, which do not include a compensation circuit, is also indicated in FIG. 6.

For the comparative output signal Div_out_old, lines 504 indicate the total period of one cycle of both Div_out and Div_out_old. Line 606 indicates the total "off" time in one cycle when Div_out_old is inactive, and line 608 indicates the total "on" time in one cycle when Div_out_old is active. The duty cycle of Div_out_old is defined as the total "on" time 608 divided by the total period 504, or as (1/frequency ratio)×100%, or 0.83% for the frequency ratio of 120. The limited duty cycle of Div_out_old is caused by Div_out_old being active at logic "low" only in one cycle of $F_{VCO}$ (not shown in FIG. 6) when the counter value reaches zero.

For the output signal Div_out in the example configuration in accordance with some embodiments, line 612 indicates the total "off" time in one cycle when Div_out is inactive, and line 614 indicates the total "on" time in one cycle when Div_out is active. The duty cycle of Div_out is defined as the total "on" time 614 divided by the total period 504, or as (threshold/frequency ratio)×100%. At the threshold of 32 (corresponding to the selected ">32 comparator") and the frequency ratio of 120, the duty cycle of Div_out is (32/120)×100%, or 26.7%, i.e., much higher than the duty cycle of 0.83% of the comparative output signal. The increase of the duty cycle of Div_out is caused by Div_out being active at logic "low" while the counter value is at 31, 30, . . . and zero below the threshold value of 32, i.e., during 32 cycles of $F_{VCO}$ (not shown in FIG. 6).

As can be seen from FIG. 6, due to the ver limited duty cycle of 0.83%, the pulse width (i.e., 608) of the comparative output signal Div_out_old, at the frequency of 1200 Mhz of the clock signal 105, is only 416 ps, i.e., less than half nanosecond. Such an extremely narrow pulse width of Div_out_old is very likely to cause the operation of a level shifter coupled to receive Div_out_old to fail. In contrast, with the higher duty cycle of 26.7%, the pulse width (i.e., 614) of Div_out is about 13.4 ns, i.e., 32 times wider than the pulse width of Div_out_old, therefore ensuring circuit performance of a level shifter or other circuitry coupled to received D_out.

In some embodiments, by appropriately selecting the thresholds of the comparator circuits 110/410 and/or the numeric ranges at which the comparator selector circuit 112 or multiplexer 412 selects a comparator output signal corresponding to the frequency ratio, it is possible to output Div_out having a duty cycle in a specific range, e.g., between 25-50%, at various frequency ratio values. The specific range of 25-50% is an example of a desirable range of duty cycle in which other circuitry coupled to receive an output signal from a frequency divider circuit in accordance with some embodiments are configured to optimally operate and/or produce reliable processing. Other duty cycle ranges are achievable in at least one embodiment, by appropriately selecting the thresholds of the comparator circuits 110/410 and/or the numeric ranges of the comparator selector circuit 112 or multiplexer 412 as described herein.

In some embodiments, the compensation circuit 102/402 is implemented by a few standard logic elements, such OR gate, multiplexer, flip-flop etc. As a result, additional requirements for power consumption and/or chip area are negligible in at least one embodiment.

In some embodiments, the logic elements of the comparator circuits 110/410 and comparator selector circuit 112/multiplexer 412 in the compensation circuit 102/402 cause a total delay or phase-shift of less than one clock cycle of the clock signal 105. Upon synchronization with the clock signal 105 by the retime circuit 114/flip-flop 414, the output signal Div_out of the frequency divider circuit 100/400 is delayed by only one clock cycle from the clock signal 105. As a result, the processing speed of the frequency divider circuit 100/400 and/or other circuitry receiving Div_out is not significantly affected in at least one embodiment.

In some embodiments, the retime circuit 114/flip-flop 414 is configured to synchronize Div_out with the clock signal 105 as described herein. As a result, it is possible to obtain Div_out which is glitch-free in at least one embodiment.

In some embodiments, the configuration of the compensation circuit 102/402 and/or the whole frequency divider circuit 100/400 is independent of, or not affected by, manufacturing process, supply voltage, and temperature (PVT) variations.

In some embodiments, given an intended range of frequency ratios, it is possible to design a configuration of the compensation circuit 102/402, e.g., by appropriately selecting thresholds of the comparator circuits 110/410 and/or numeric ranges of the comparator selector circuit 112 or multiplexer 412, to provide a desired duty cycle of Div_out at any frequency ratio in the intended range of frequency ratios.

The frequency divider circuit in accordance with some embodiments is applicable to various circuitry where a divided-frequency signal is desirable. An example circuitry using a frequency divider circuit in accordance with some embodiments is described with respect to FIG. 7.

Figure 7:
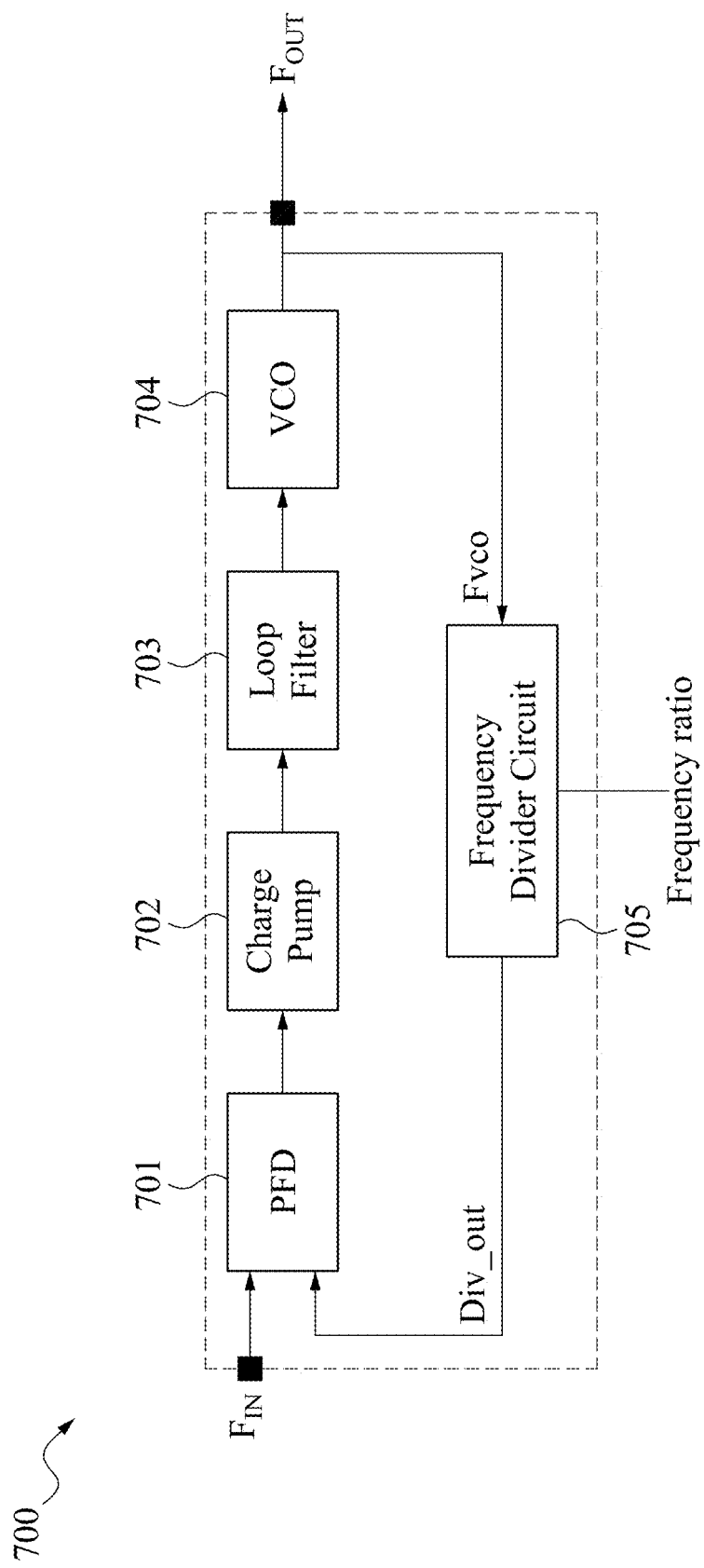
FIG. 7 is a schematic block diagram of a PLL including a frequency divider circuit in accordance with some embodiments.

FIG. 7 is a schematic block diagram of a PLL 700 in accordance with some embodiments. The PLL 700 includes a phase/frequency detector (PFD) 701, a charge pump 702, a loop filter 703, a VCO 704 and a frequency divider circuit 705, all coupled in a closed loop. In at least one embodiment, the frequency divider circuit 705 corresponds to the frequency divider circuit 100 and/or the frequency divider circuit 400. An input signal $F_{IN}$ is input into the PFD 701 together with Div_out from the frequency divider circuit 705. The input signal $F_{IN}$ propagates through the charge pump 702, loop filter 703, and VCO 704. In at least one embodiment, the VCO 704 corresponds to the VCO 104 described with respect to FIG. 1. The clock signal $F_{OUT}$ having the frequency $F_{VCO}$ is output by the VCO 704 and input into the frequency divider circuit 705, which generates Div_out having a frequency obtained by dividing $F_{VCO}$ by a frequency ratio as described herein. Except for the operation of the frequency divider circuit 705, the PLL 700 operates in a manner understood in the art, and a detailed description of the operations of the other components of the PLL 700 is omitted herein.

Figure 8:
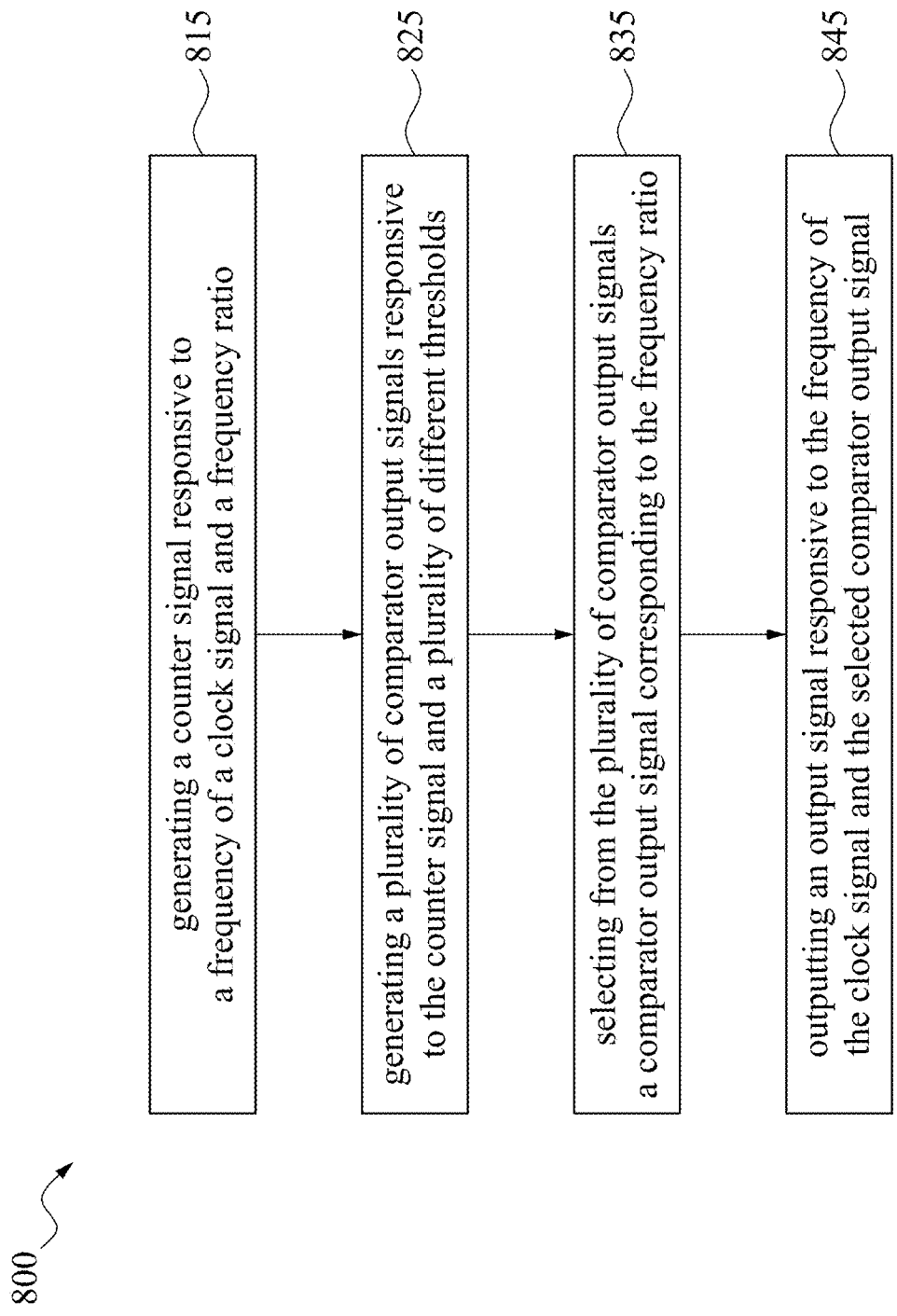
FIG. 8 is a flowchart of a method in accordance with some embodiments.

FIG. 8 is a flowchart of a method 800 in accordance with some embodiments. In at least one embodiment, the method 800 is performed by the frequency divider circuit 100 and/or the frequency divider circuit 400.

At operation 815, a counter signal is generated responsive to a frequency of a clock signal and a frequency ratio. For example, a counter signal 111 is generated by a counter 101 responsive to a frequency $F_{VCO}$ of a clock signal 105 and a frequency ratio, as described with respect to FIG. 1.

At operation 825, a plurality of comparator output signals is generated responsive to the counter signal and a plurality of different thresholds. For example, a plurality of comparator output signals 116-117 or 415 is generated, by the comparator circuits 110 or 410, responsive to the counter signal 111 and a plurality of different thresholds as described with respect to FIG. 1 or FIG. 4. In another example, a plurality of comparator output signals 214, 216, 218 is generated, by comparators 204, 206, 208, responsive to the counter signal 111 and a plurality of different thresholds 2, 4, 8, respectively, as described with respect to FIG. 2.

At operation 835, from the plurality of comparator output signals, a comparator output signal corresponding to the frequency ratio is selected. For example, the comparator selector circuit 112 or multiplexer 412 selects, from the plurality of comparator output signals 116-117 or comparator output signals 416, a comparator output signal corresponding to the frequency ratio input via the signal 118, as described with respect to FIG. 1 or FIG. 4. In another example, the comparator selector circuit 300 selects, based on a plurality of numeric ranges corresponding to the plurality of comparator output signals, a comparator output signal corresponding to the frequency ratio, as described with respect to FIG. 3.

At operation 845, an output signal responsive to the frequency of the clock signal and the selected comparator output signal is output, for example, as the signal 120, 122 or Div_out described with respect to FIG. 1 or FIG. 4.

In at least one embodiment, all operations 815, 825, 835, 845 are automatically performed without user input or intervention.

The described methods and algorithms include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a frequency divider circuit comprises a counter configured to generate a counter signal responsive to a frequency of a clock signal and a frequency ratio, and a compensation circuit coupled to the counter, and configured to generate an output signal. The output signal has a frequency equal to the frequency of the clock signal divided by a frequency ratio, and a duty cycle greater than 1/r, where r is the frequency ratio.

In a method in accordance with some embodiments, a counter signal is generated responsive to a frequency of a clock signal and a frequency ratio. A plurality of comparator output signals is generated responsive to the counter signal and a plurality of different thresholds. From the plurality of comparator output signals, a comparator output signal corresponding to the frequency ratio is selected. An output signal responsive to the frequency of the clock signal and the selected comparator output signal is output.

In some embodiments, a compensation circuit for a frequency divider circuit comprises a plurality of comparator circuits, a comparator selector circuit and a retime circuit. The plurality of comparator circuits has a plurality of different thresholds, and is configured to receive a counter signal corresponding to a frequency of a clock signal and a frequency ratio, and generate a plurality of comparator output signals responsive to the counter signal and the plurality of different thresholds. The comparator selector circuit is coupled to outputs of the plurality of comparator circuits, and configured to select from the plurality of comparator output signals a comparator output signal corresponding to the frequency ratio. The retime circuit is coupled to an output of the comparator selector circuit, and configured to receive the clock signal, and generate an output signal responsive to the frequency of the clock signal and the selected comparator output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A frequency divider circuit, comprising:
   a counter configured to generate a counter signal responsive to a frequency of a clock signal and a frequency ratio; and
   a compensation circuit coupled to the counter, and configured to generate an output signal having
      a frequency equal to the frequency of the clock signal divided by the frequency ratio, and
      a duty cycle greater than 1/r, where r is the frequency ratio,
   wherein
   the compensation circuit comprises a plurality of comparator circuits coupled to an output of the counter, having a plurality of different thresholds, and configured to generate a plurality of comparator output signals responsive to the counter signal and the plurality of different thresholds.

2. The frequency divider circuit of claim 1, wherein the plurality of comparator circuits comprises OR gates.

3. The frequency divider circuit of claim 1, wherein the compensation circuit further comprises a comparator selector circuit coupled to outputs of the plurality of comparator circuits, and configured to select from the plurality of comparator output signals a comparator output signal corresponding to the frequency ratio.

4. The frequency divider circuit of claim 3, wherein the comparator selector circuit has a plurality of different numeric ranges corresponding to the plurality of comparator output signals, and
the comparator selector circuit is configured to, responsive to the frequency ratio falling in a numeric range among the plurality of different numeric ranges, select and output the comparator output signal corresponding to said numeric range.

5. The frequency divider circuit of claim 3, wherein the comparator selector circuit comprises a multiplexer.

6. The frequency divider circuit of claim 3, wherein the compensation circuit further comprises a retime circuit coupled to an output of the comparator selector circuit, and configured to generate the output signal responsive to the frequency of the clock signal and the selected comparator output signal.

7. The frequency divider circuit of claim 6, wherein the retime circuit comprises a flip-flop having
   a first input terminal configured to receive the clock signal,
   a second input terminal coupled to the output of the comparator selector circuit to receive the selected comparator output signal, and
   an output terminal configured to output the output signal.

8. The frequency divider circuit of claim 1, wherein each of the plurality of different thresholds is $2^j$, where j is an integer.

9. A method, comprising:
   generating a counter signal responsive to a frequency of a clock signal and a frequency ratio;
   generating a plurality of comparator output signals responsive to the counter signal and a plurality of different thresholds;
   selecting from the plurality of comparator output signals a comparator output signal corresponding to the frequency ratio; and
   outputting an output signal responsive to the frequency of the clock signal and the selected comparator output signal.

10. The method of claim 9, wherein
a logic level of each of the plurality of comparator output signals is switched responsive to a counter value of the counter signal reaching a corresponding threshold among the plurality of different thresholds.

11. The method of claim 10, wherein
each of the plurality of different thresholds is $2^j$, where j is an integer.

12. The method of claim 10, wherein
the plurality of comparator output signals correspond to a plurality of different numeric ranges, and
in said selecting, responsive to the frequency ratio falling in a numeric range among the plurality of different numeric ranges, the comparator output signal corresponding to said numeric range is selected as corresponding to the frequency ratio.

13. The method of claim 12, wherein
the plurality of different numeric ranges comprise non-overlapping numeric ranges.

14. The method of claim 12, wherein
each of the plurality of different numeric ranges is from $2^k$ to $(2^{k+1}-1)$, where k is an integer.

15. The method of claim 12, wherein
in said outputting, the selected comparator output signal is synchronized with the clock signal to generate the output signal having
   a frequency equal to the frequency of the clock signal divided by the frequency ratio, and
   a duty cycle equal to the threshold corresponding to the selected comparator output signal divided by the frequency ratio.

16. The method of claim 15, wherein
the duty cycle of the output signal is between 25% and 50%.

17. A compensation circuit for a frequency divider circuit, the compensation circuit comprising:
   a plurality of comparator circuits having a plurality of different thresholds, and configured to
      receive a counter signal corresponding to a frequency of a clock signal and a frequency ratio, and
      generate a plurality of comparator output signals responsive to the counter signal and the plurality of different thresholds;
   a comparator selector circuit coupled to outputs of the plurality of comparator circuits, and configured to select from the plurality of comparator output signals a comparator output signal corresponding to the frequency ratio; and
   a retime circuit coupled to an output of the comparator selector circuit, and configured to
      receive the clock signal, and
      generate an output signal responsive to the frequency of the clock signal and the selected comparator output signal.

18. The compensation circuit of claim 17, wherein
the plurality of comparator circuits comprises OR gates coupled to a plurality of different sets of bits of the counter signal, and
the plurality of different sets of bits corresponds to the plurality of different thresholds each of which is $2^j$, where j is an integer.

19. The compensation circuit of claim 17, wherein
the comparator selector circuit comprises a multiplexer having a plurality of inputs coupled to corresponding outputs of the plurality of comparator circuits,
the multiplexer has a plurality of different numeric ranges, each of which is from $2^k$ to $(2^{k+1}-1)$, where k is an integer, and
the multiplexer is configured to, responsive to the frequency ratio falling in a numeric range among the plurality of different numeric ranges, select and output the comparator output signal corresponding to said numeric range to the retime circuit.

20. The compensation circuit of claim 17, wherein
the retime circuit comprises a flip-flop having
   a first input terminal configured to receive the clock signal,
   a second input terminal coupled to the output of the comparator selector circuit to receive the selected comparator output signal, and
   an output terminal configured to output the output signal being the selected comparator output signal synchronized with the clock signal.

\* \* \* \* \*